(12) United States Patent
Gandhi et al.

(10) Patent No.: US 10,566,276 B2
(45) Date of Patent: Feb. 18, 2020

(54) PACKAGED SEMICONDUCTOR SYSTEM HAVING UNIDIRECTIONAL CONNECTIONS TO DISCRETE COMPONENTS

(71) Applicant: Texas Instruments Incorporated, Dallas, TX (US)

(72) Inventors: Saumya Gandhi, Irving, TX (US); Matthew David Romig, Wylie, TX (US); Abram Castro, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/807,114

(22) Filed: Nov. 8, 2017

(65) Prior Publication Data

US 2019/0139883 A1 May 9, 2019

(51) Int. Cl.
| | |
|---|---|
| H01L 23/50 | (2006.01) |
| H01L 23/522 | (2006.01) |
| H01L 25/065 | (2006.01) |
| H01L 49/02 | (2006.01) |
| H01G 4/005 | (2006.01) |
| H01L 23/31 | (2006.01) |
| H01L 23/532 | (2006.01) |

(52) U.S. Cl.
CPC ............. *H01L 23/50* (2013.01); *H01G 4/005* (2013.01); *H01L 23/3121* (2013.01); *H01L 23/5222* (2013.01); *H01L 23/5328* (2013.01); *H01L 25/0657* (2013.01); *H01L 28/60* (2013.01); *H01L 2224/81801* (2013.01); *H01L 2924/14* (2013.01); *H01L 2924/19041* (2013.01); *H01L 2924/19043* (2013.01); *H01L 2924/30107* (2013.01)

(58) Field of Classification Search
CPC . H01L 2924/00014; H01L 2224/48091; H01L 2924/181; H01L 2224/0401
See application file for complete search history.

(56) References Cited

U.S. PATENT DOCUMENTS

| | | | |
|---|---|---|---|
| 8,084,841 | B2 | 12/2011 | Pulugurtha et al. |
| 8,174,017 | B2 | 5/2012 | Pulugurtha et al. |
| 9,572,261 | B2 | 2/2017 | Romig et al. |
| 2008/0145589 | A1* | 6/2008 | Hung ............... H05K 1/144 |
| | | | 428/68 |

(Continued)

*Primary Examiner* — Jaehwan Oh
(74) *Attorney, Agent, or Firm* — Dawn Jos; Charles A. Brill; Frank D. Cimino (57) ABSTRACT

A packaged semiconductor system, including: at least one electronic device on a device mounting surface of a substrate having terminals for attaching bond wires; at least one discrete component adjacent to the at least one electronic device, a second electrode of the at least one discrete component parallel to and spaced from a first electrode by a component body; the first electrode a metal foil having a protrusion extending laterally from the body and having a surface facing towards the second electrode; bonding wires interconnecting respective terminals of the at least one electronic device, the first electrode and the second electrode, and bonded to the surface of the second electrode and to the protrusion that extend away from the respective surfaces in a same direction; and packaging compound covering portions of the at least one electronic device, the at least one discrete component, and the bonding wires.

20 Claims, 7 Drawing Sheets

(56) References Cited

U.S. PATENT DOCUMENTS

| | | | |
|---|---|---|---|
| 2009/0057723 A1* | 3/2009 | Kaneko | H01L 23/62 257/209 |
| 2010/0182225 A1* | 7/2010 | Huang | G09G 3/32 345/83 |
| 2013/0026632 A1* | 1/2013 | Kikuchi | H01L 21/6835 257/753 |

* cited by examiner

PACKAGED SEMICONDUCTOR SYSTEM HAVING UNIDIRECTIONAL CONNECTIONS TO DISCRETE COMPONENTS

TECHNICAL FIELD

This disclosure relates to the field of semiconductor devices and processes, and more specifically to the structure and fabrication method of packaged semiconductor systems with unidirectional connections to discrete components such as nanoparticle capacitors.

BACKGROUND

The ongoing market trend to involve semiconductor devices in new applications continues to strive for reductions of physical device size while simultaneously requiring enhanced device performance. This market pressure holds for active semiconductor devices as well as for passive components and for systems combining active and passive elements. Passive components include inductors, coils, resistors and capacitors. Among the passive components of electronic systems are capacitors of various sizes. To save real estate of a system and reduce parasitics, capacitors are fabricated in small size by using thin metal electrodes and thin dielectric materials and are often placed as piece parts in tight proximity to other system components, such as transistors and inductors. To further conserve system real estate and minimize parasitic electrical effects, these components are sometimes placed under or on top of other components. For example discrete capacitors are sometimes placed on top of other components.

Electronics systems include power supply devices for converting one DC voltage to another DC voltage. The converters include switching converters where power transistors are turned on and off at a frequency of up to several MHz. The on time is determined by using pulse width modulation at the gate terminal of a transistor coupled between a power source and a switching node, which is coupled to an output terminal through resonant circuit using a capacitor and inductor to smooth the ripple from the output voltage. For many power switching devices, the integrated circuit (IC) that includes the power metal oxide semiconductor field effect transistors (MOSFETs), and a gate driver IC and a controller IC are assembled as individual components. The ICs are typically attached to a rectangular or square-shaped pad of a metallic leadframe; the pad is surrounded by leads that form output terminals. This approach consumes area and increases the footprint of the module. In another recently introduced scheme, the control IC and the driver IC are assembled vertically on top of the other as a stack. In this assembly, at least one MOSFET IC can be configured for vertical current flow; the source electrode of the control IC is facing the drain electrode of the driver IC.

Stacked chip (a "chip" is a semiconductor die) power MOSFETs have been proposed that integrate a capacitor into a package of the system. To increase the obtainable value of capacitance per area by at least one order of magnitude, capacitors have recently been demonstrated based on the concept of folding the third dimension into the area of two dimensions: cavities are etched into metal boards made, for example, of aluminum; the aluminum surface in the cavities is then oxidized, and the cavities are filled with a conductive material such as a polymeric compound. The three-dimensional structure, or body, thus formed may obtain contacts, or electrodes, to the metal board and the conductive polymeric compound, and can be operated as a capacitor offering high capacitance values. These capacitors are referred to as nanoparticle capacitors.

However, especially when the passive components are nanoparticle capacitors made with thin parallel electrodes and with a thin body between the electrodes, these discrete capacitors are difficult to integrate into the packages of the system, since elaborate via or vertical interconnection processes are needed to reach both of the parallel electrodes of the capacitors. Among the methods employed are conductive vertical attachment materials such as epoxies and solders, vertical vias drilled through the capacitor layers, and substrates with vertical interconnects; however, these methods are cumbersome and expensive.

SUMMARY

In a described example, a packaged semiconductor system, including: at least one electronic device on a device mounting surface of a substrate and substrate contact pads on the device mounting surface, the at least one electronic device having terminals configured for attaching bond wires; at least one discrete component attached by a first electrode to the device mounting surface of the substrate at a position adjacent to and spaced from the at least one electronic device, a second electrode of the at least one discrete component parallel to and spaced from the first electrode by a body of the component, the body of the component having sidewalls at right angles with the first electrode; the first electrode being a metal foil having a protrusion extending laterally from a sidewall of the at least one discrete component, the protrusion having a surface facing towards the second electrode; the second electrode being a conductive layer having a surface facing away from the surface of the first electrode; bonding wires interconnecting respective terminals of the at least one electronic device, the first electrode and the second electrode, and the substrate contact pads, in which the bonding wires that are bonded to the surface of the second electrode and that are bonded to the protrusion of the first electrode extend away from the respective surfaces of the first electrode and the second electrode in a same direction; and packaging compound covering portions of the at least one electronic device, the at least one discrete component, and the bonding wires.

DETAILED DESCRIPTION

Corresponding numerals and symbols in the different figures generally refer to corresponding parts unless otherwise indicated. The figures are not necessarily drawn to scale.

As is further described hereinbelow, certain structures and surfaces are described as "parallel" to one another. For purposes of this disclosure, two elements are "parallel" when the elements are intended to lie in planes that, when extended, will not meet. However, the term parallel as used herein also includes surfaces that may slightly deviate in direction due to manufacturing tolerances, if the two surfaces generally lie in planes that are spaced apart and which would not intersect when extended infinitely if made the surfaces were made without these deviations, these surfaces are also parallel. Parallel surfaces extend in a direction side by side and do not meet.

In the description hereinbelow, certain elements are described as "flat". Flat surfaces are relatively smooth and even. However, some variations on surfaces occur due to the tolerances of manufacturing. The term "flat" used herein means a surface intended to be relatively smooth and even, even if slight differences occur in the surface as finally manufactured.

Figure 1A:
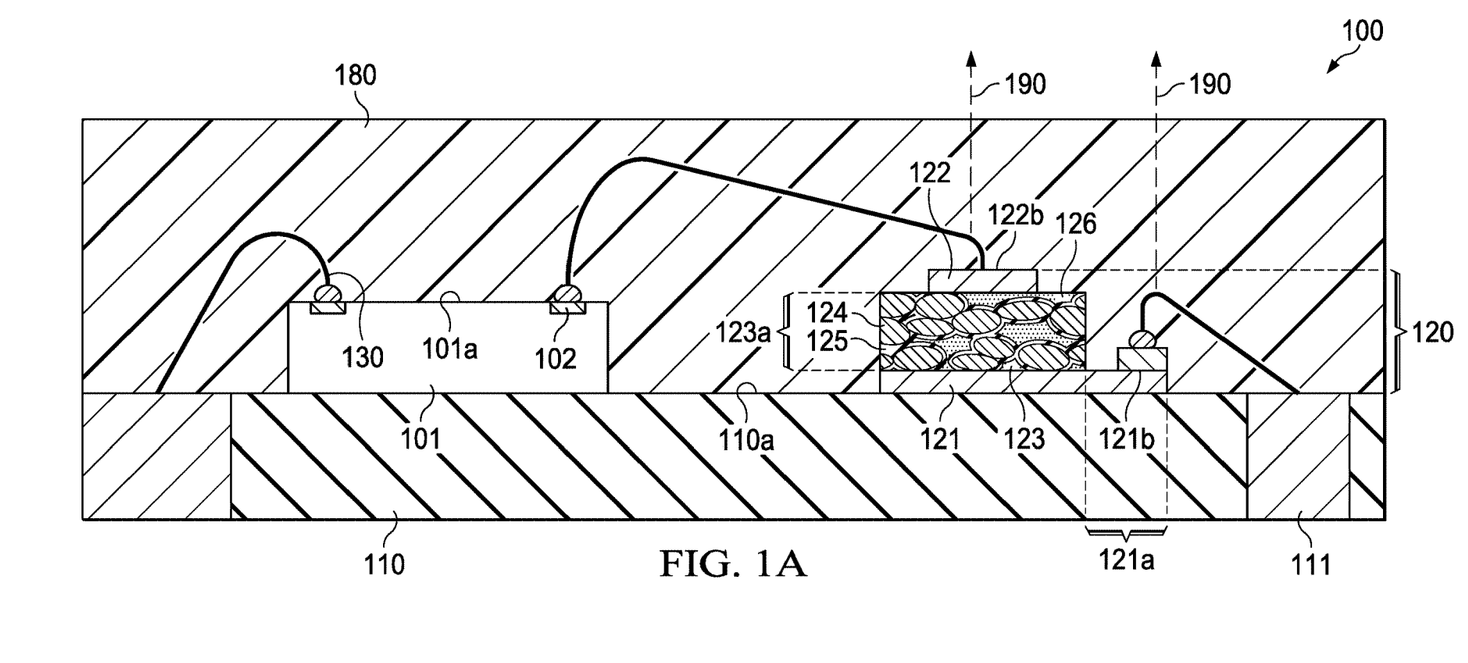
FIG. 1A is a cross section of an arrangement for a packaged semiconductor system with unidirectional connections to a discrete component.

FIG. 1A illustrates in a cross section an example arrangement for an electronic system 100, which includes an electronic device, in this example a semiconductor device, and a discrete component, here a capacitor, on a substrate. While in the FIG. 1A a single electronic device is shown arranged with a single discrete capacitor, in alternative arrangements at least one, or more than one, electronic device can be arranged with at least one, or more than one, discrete components on a substrate. In FIG. 1A, the electronic device 101 is a semiconductor die or an integrated circuit die with a surface 101a, (the upper surface of electronic device 101 as oriented in FIG. 1) which includes terminals 102. Terminals 102 are bondable. As used herein, the feature of being "bondable" includes the feasibility of establishing electrical contact between electrically conducting pieces by means of metal interdiffusion, electron conduction and tunneling, and forming intermetallic compounds and solder compounds. In order to facilitate bondability, bondable surfaces can be covered by a layer of metals such as tin, silver, gold, nickel, palladium, copper, aluminum, and alloys and combinations thereof. The substrate 110 may be a leadframe or may be a laminated substrate providing surface 110a for device mounting, for example for attaching electronic device 101 and other components. Substrate 110 has contact pads 111 on the device mounting surface. Contact pads 111 are bondable. The bondable substrate contact pads 111 are useful for making electrical connections to the electronic system 100 and an exterior surface of contact pads 111 remains exposed in the finished packaged electronic system. When the substrate 110 is a conductive material, such as a conductive leadframe, a conductive adhesive (sometimes referred to as a "die attach") can be used to mount the electronic device 101, a semiconductor die. In an alternative approach, the adhesive can be a thermally conductive adhesive to promote thermal transfer from the electronic device 101. The adhesive can be, in additional alternative arrangements, an insulating material. The substrate can also be insulating material. Materials used for substrates in semiconductor assemblies that are useful in the arrangements include, among others: flame retardant materials such as FR-4 (a glass reinforced flame retardant epoxy resin), other epoxy resins, polyimides, bismaleimide-triazine (BT) resin, fiberglass, ceramic, flexible materials such as Kapton or other films, and conductive lead frames including metal lead frames.

Discrete component 120 shown in FIG. 1A is a capacitor attached to a portion of substrate 110 on the surface 110a by the first electrode 121, a flat electrode. In this example arrangement, discrete component 120 is a capacitor. However, other discrete components including resistors, coils, inductors, fuses and antifuses can be formed in a similar manner and these form additional alternative arrangements. Layers of conductors spaced by interleaving dielectric layers can be formed. First electrode 121 is a flat metal foil of few micrometer thickness, for example between 10 and 50 microns. The metal foil may include, for example, tantalum, or aluminum. The attachment of discrete component 120 on substrate 110 is adjacent to and spaced from the electronic device 101 on the mounting surface 110a. First electrode 121 is spaced from second electrode 122 which is parallel to the first electrode 121 by a body of the discrete component 120, which in this example is a sheet 123 of capacitive elements. Sheet 123 has sidewalls 123a, which are at right angles with respect to the first and second electrodes (121 and 122). In additional alternative arrangement, the first electrode 121 can be spaced from the second electrode 122 by the body of a resistive material to form a resistor, or by coil materials such as planar coils in dielectric layers to form an inductor. Fuses, antifuses, and other components can be formed between the first electrode 121 and the second electrode 122 to form additional arrangements. The discrete components have a body between electrodes 121 and 122 and have sidewalls at a right angle to the flat surface of first electrode 121.

The metal foil of first electrode 121 has a protrusion 121a, which extends outward from a sidewall 123a of the sheet 123. The surface 121b of protrusion 121a, which faces towards the second electrode 122, is bondable. Surface 121b may, for example, include one or more metal layers such as silver or gold, which facilitates the formation of reliable metal bonds. As a consequence, bonds, such as wire bonds 130, which are attached to protrusion 121a, will extend from surface 121b in a direction towards second electrode 122.

In FIG. 1A, a pair of wire bonds 130 is shown contacting the electronic device 101 (a semiconductor die). In alternative arrangements, the number of wire bonds 130 can vary greatly from one wire bond to the discrete component 120, to hundreds of wire bonds including at least one to the discrete component 120. The wire bonds 130 can be of very fine wire materials including gold, silver, aluminum, copper, and alloys and compounds thereof. The wire bonds can be replaced by prefabricated pieces such as clips, or rails, formed of conductive material. Ribbon bonds of flat conductors can be used. Use of these alternatives form additional arrangements of the present application.

In FIG. 1A, the second electrode 122 is a metal layer that has a surface 122b facing away from first electrode 121. Surface 122b is bondable. As a consequence, bonds, such as wire bonds 130, which are attached to second electrode 122, will extend from surface 122b in the direction away from surface 122b, and in the same direction as any wire bonds attached to protrusion 121a of first electrode 121.

The fact that wire bonds extend mutually in identical direction is illustrated in FIG. 1A, where wire bonds 130 are shown to interconnect respective terminals 102 of the electronic device 101 and substrate contact pads 111. As FIG. 1A shows, the wire bonds 130 bonded to the second electrode 122 and the first electrode's protrusion 121a extend away from the respective surfaces in the same direction 190.

The electronic system 100 needs to be packaged to protect the devices and the wire bonds. FIG. 1A shows packaging compound 180—which can be an epoxy-based thermoset molding compound—encapsulating the electronic device 101, the discrete component 120, and the wire bonds 130. Packaging compound 180 is an insulator. The encapsulation process—especially a molding process—ensures that the gap between the sidewall 123a and the wire bonds 130 affixed to protrusion surface 121b is filled with insulating packaging compound. An accidental electrical contact between wire 130 and sidewall 123a is thus prevented. In addition, gaps between discrete component 120 and electronic device 101 are filled with packaging compound 180, which is an insulator. Note that although the packaging technique is described as "encapsulating" the electronic device 101, a semiconductor die in FIG. 1A, the discrete component 120, and the wire bonds 130, portions of the electronic system 100 including a second surface of substrate 110 opposite the surface 101a that is spaced away from the devices, and which is the bottom surface of substrate 110 as oriented in FIG. 1A, and the bottom surface of contact pads 111, are not covered by the packaging compound 180. The bottom surface of contact pads 111 form external terminals for the electronic system 100 and have at least one surface that remains exposed from the packaging compound 180 for facilitating electrical connection to the discrete component 120 and/or to the electronic device 101 in the electronic system 100. Electronic system 100 may later be surface mounted on a circuit board, for example, with the terminals formed by contact pads 111 in electrical contact with lands on a circuit board. The electronic system 100 with the packaging compound 180 form a packaged semiconductor system.

In the example arrangement of FIG. 1A, sheet 123 of capacitive elements includes a porous conglomerate of metal particles 124. In fabricating the sheet 123, the metal particles 124 are sintered and may be referred to as "sintered metal particles." When the size of the metal particles is between 1 and 100 nanometers, the metal particles 124 are sometimes referred to as "nanoparticles." The arrangements can use sintered metal particles including nanoparticles. The metal particles 124 are contacted by first electrode 121. The metal particle surfaces are covered with a dielectric skin 125, which can be created by oxidation of the metal particles 124 or by coating the metal particles 124 with an insulating material. As FIG. 1A shows, the voids and pores between the dielectric skin-covered sintered metal particles 124 are filled by a conductive polymeric material 126. The conductive polymeric material 126 is contacted by second electrode 122. Due to a density of approximately 200 µF/cm$^2$ or less and a capacitor stability up to 125° C., the sheet 123 is operable as a high-density capacitor with first electrode 121 a metal film, second electrode 122 a metal layer, and dielectric skin 125 of the metal particles 124 as a capacitor insulator.

In some electronic systems 100 with the electronic device 101 as an integrated circuit die, first electrode 121 has been made of tantalum; the metal particles 124 include tantalum, and the dielectric skin 125 of the metal particles 124 include tantalum oxide. In other systems, aluminum and aluminum oxide have been applied as the metal particles and the dielectric skin.

Figure 1B:
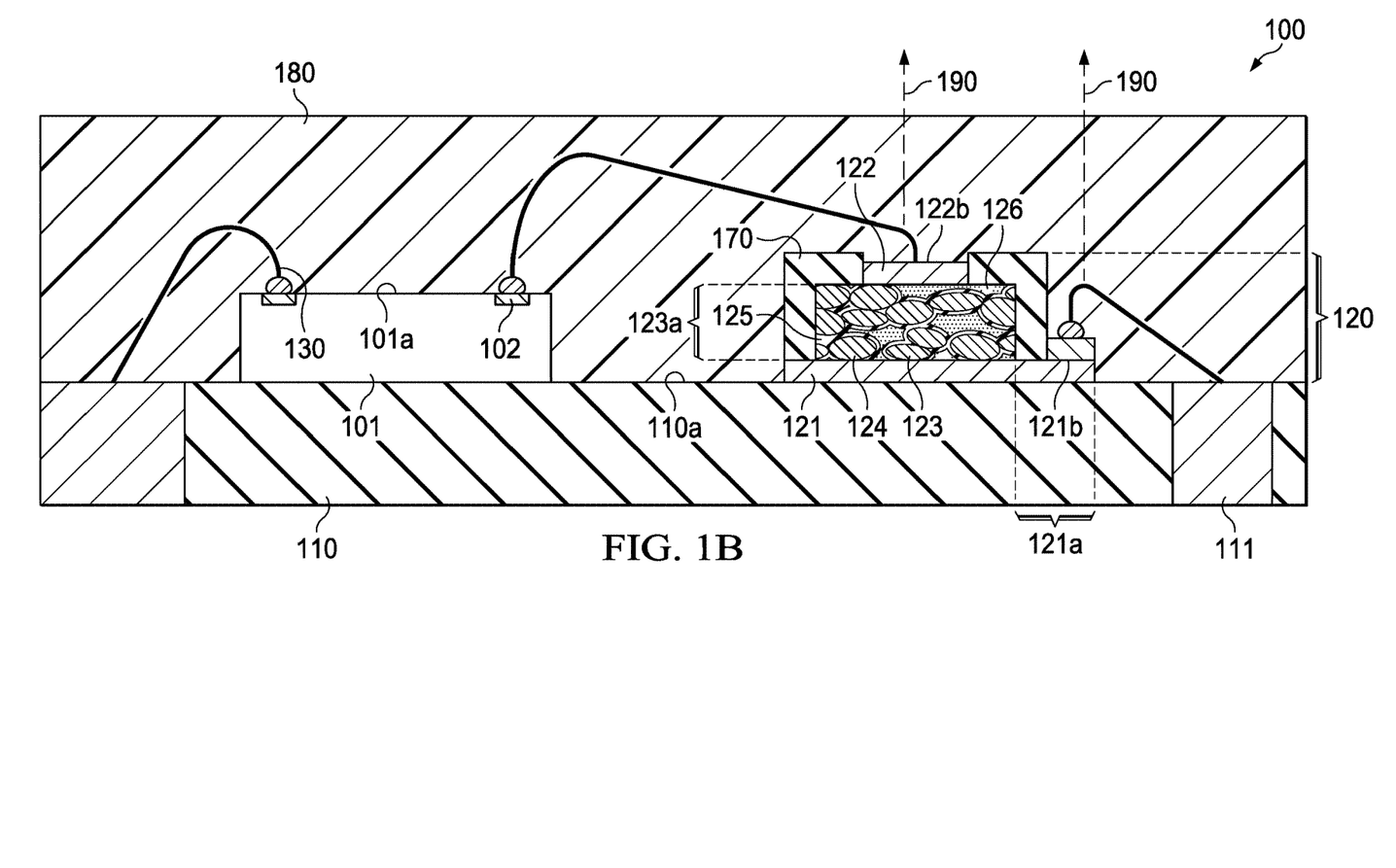
FIG. 1B is a cross section of an alternative arrangement similar to that of FIG. 1A where the discrete capacitor has insulating layers on its side walls.

FIG. 1B illustrates in another cross section an alternative arrangement for a system that is in many respects analogous to the arrangement shown in FIG. 1A. However, in the arrangement of FIG. 1B discrete component 120 includes layers of insulating material 170, which cover the sidewalls 123a of sheet 123. An example insulating material is a polyimide compound. The presence of insulating material 170 prevents any incidental electrical contact between sidewalls 123a and wire bonds 130 contacting the protrusion 121a of first electrode 121.

In additional arrangements, the discrete component, for example a capacitor as described hereinabove, can be replaced by other passive components. Examples include: resistors; coils fuses; antifuses; and inductors. The foil based discrete component can be extended using a three dimensional (3D) arrangement to increase device density. For example, capacitors can be stacked. Layers of dielectric material can be vertically arranged. Inductors can be formed of planar coils that are stacked to form higher value inductors. Transformer devices can be formed of stacked coils. Resistor chains can be formed in a 3D arrangement. Accordingly, while the discrete components shown herein are capacitors in one example, additional arrangements of the present application include resistors, inductors, transformers, and 3D stacked devices or multiple layer devices mounted in a package with an integrated circuit.

Figure 2A:
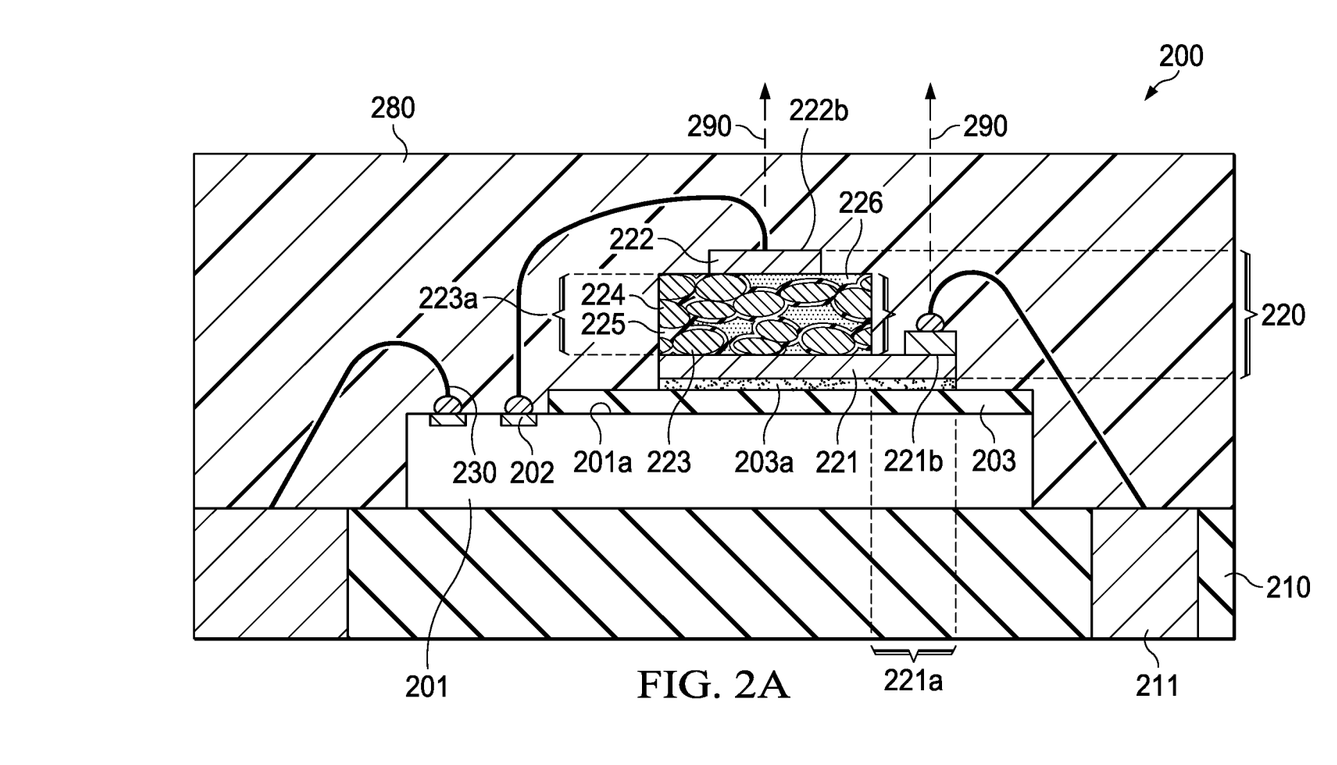
FIG. 2A is a cross section of another arrangement for a packaged semiconductor system with unidirectional connections to a discrete nanoparticle capacitor.

For many applications, especially where the height of the package of electronic system 100 needs to be minimized, electronic device 101 (a semiconductor die in FIGS. 1A-1B) and discrete component 120 (a capacitor in FIGS. 1A-1B) are assembled on the mounting surface of substrate 110 with output terminals side by side as individual components. While this approach allows small packaged electronic system heights, it consumes area and increases the foot print of the area of the semiconductor system. FIG. 2A illustrates in another cross section another example arrangement where an electronic device 201 and discrete capacitor 220 are assembled vertically one on top of the other as a stack on substrate 210. This alternative arrangement saves substrate area and may reduce parasitic electrical effects.

In the example arrangement of an electronic system 200 shown in FIG. 2A, the electronic device 201 is a semiconductor die or an integrated circuit die with a surface 201a, which includes terminals 202. Terminals 202 are bondable. The substrate 210 may be a leadframe or may be a laminated substrate providing an area 210a for attaching electronic device 201 and other components. Substrate 210 has contact pads 211, which are bondable. If the substrate 210 is a leadframe, the area 210a may be spaced from other conductive pads to create electrical isolation between the electronic device 201 mounted in area 210a and other portions of the leadframe.

As FIG. 2A shows, the surface 201a of the electronic device 201 includes a film 203 of an insulating polymeric material. Film 203 covers surface 201a except the terminals 202. At least a portion of film 203 is adhesive; the adhesive character is indicated in FIG. 2A by tacky extra film 203a.

Adhering to film 203 is discrete component 220 (here a capacitor) attached by a first electrode 221. First electrode 221 is shown as a flat metal foil of few micrometer thickness. The metal foil may include, for instance, tantalum, or aluminum. First electrode 221 is spaced from a second electrode 222 by a sheet 223 of capacitive elements. Second electrode 222 is parallel to first electrode 221. Sheet 223 has sidewalls 223a, which are at right angles with the electrodes 221 and 222.

The metal foil of first electrode 221 has a protrusion 221a, which extends outward from a sidewall 223a of the sheet 223. The surface 221b of protrusion 221a, which faces towards the second electrode 222, is bondable. Consequently, bonds, such as wire bonds 230, which are attached to protrusion 221a, will extend away from surface 221b in the direction towards second electrode 222. In FIG. 2A this direction is designated 290.

In FIG. 2A, the second electrode 222 is a metal layer, which has a surface 222b facing away from first electrode 221. Surface 222b is bondable as described hereinabove. Consequently, bonds, such as wire bonds 230, which are attached to second electrode 222, will extend away from surface 222b in the direction away from surface 222b, which means in the same direction as any bonds attached to protrusion 221a of first electrode 221. The fact that wire bonds extend mutually in identical direction is illustrated in FIG. 2A, where bonding wires of the wire bonds 230 are shown to interconnect respective terminals 202 of electronic device 201 and contact pads 211 of the substrate. As FIG. 2A displays, the wire bonds 230 bonded to the second electrode 222 and the first electrode's protrusion 221a rise from the respective surfaces in the same direction 290.

Electronic system 200 needs to be packaged to protect the device, the component, and the wire bonds. FIG. 2A shows insulating packaging compound 280—preferably an epoxy-based thermoset molding compound—encapsulating the electronic device (here a semiconductor die) 201, the discrete capacitor 220, and the bonding wires used for wire bonds 230. The encapsulation process—especially a molding process—ensures that the gap between the sidewall 223a of sheet 223 and the bonding wire forming wire bond 230 (affixed to surface 221b of protrusion 221a is filled with insulating packaging compound. An accidental electrical contact between wire bond 230 and sidewall 223a is thus prevented. Note that while the process is described as an "encapsulation" process, the substrate 210 has a surface away from the electronic device 201, which is the bottom surface as oriented in FIG. 2A, that is not covered by packaging compound 280. Similarly, contact pads 211 have a bottom surface as oriented in FIG. 2A that is exposed and not covered by packaging compound 280, forming external terminals for the electronic system 200. The package for electronic system 200 can be described as an "overmolded" package because the encapsulation process forms mold compound over a device mounting surface of substrate 210, the surface where the electronic device 201 is mounted.

Sheet 223 of capacitive elements comprises a porous conglomerate of metal particles 224. In fabrication of sheet 223, the metal particles 224 are sintered. The metal particles 224 are contacted by first electrode 221. The metal particles 224 have surfaces covered with a dielectric skin 225, which can be created by oxidation of the particle metal or by coating the particles with an insulating material. As FIG. 2A shows, the voids and pores between the dielectric skin-covered sintered metal particles are filled by a conductive polymeric material 226. The conductive polymeric material 226 is contacted by second electrode 222. Due to a density of approximately 200 μF/cm$^2$ or less and a capacitor stability up to 125° C., the sheet 223 is operable as a high-density capacitor with a metal film as first electrode 221, a metal layer as second electrode 222, and dielectric skin 225 of the metal particles 224 as the insulator. In some electronic systems 200 first electrode 221 has been made of tantalum; the metal particles 224 include tantalum, and the dielectric skin 225 of the metal particles include tantalum oxide. In other systems, aluminum and aluminum oxide have been applied.

Figure 2B:
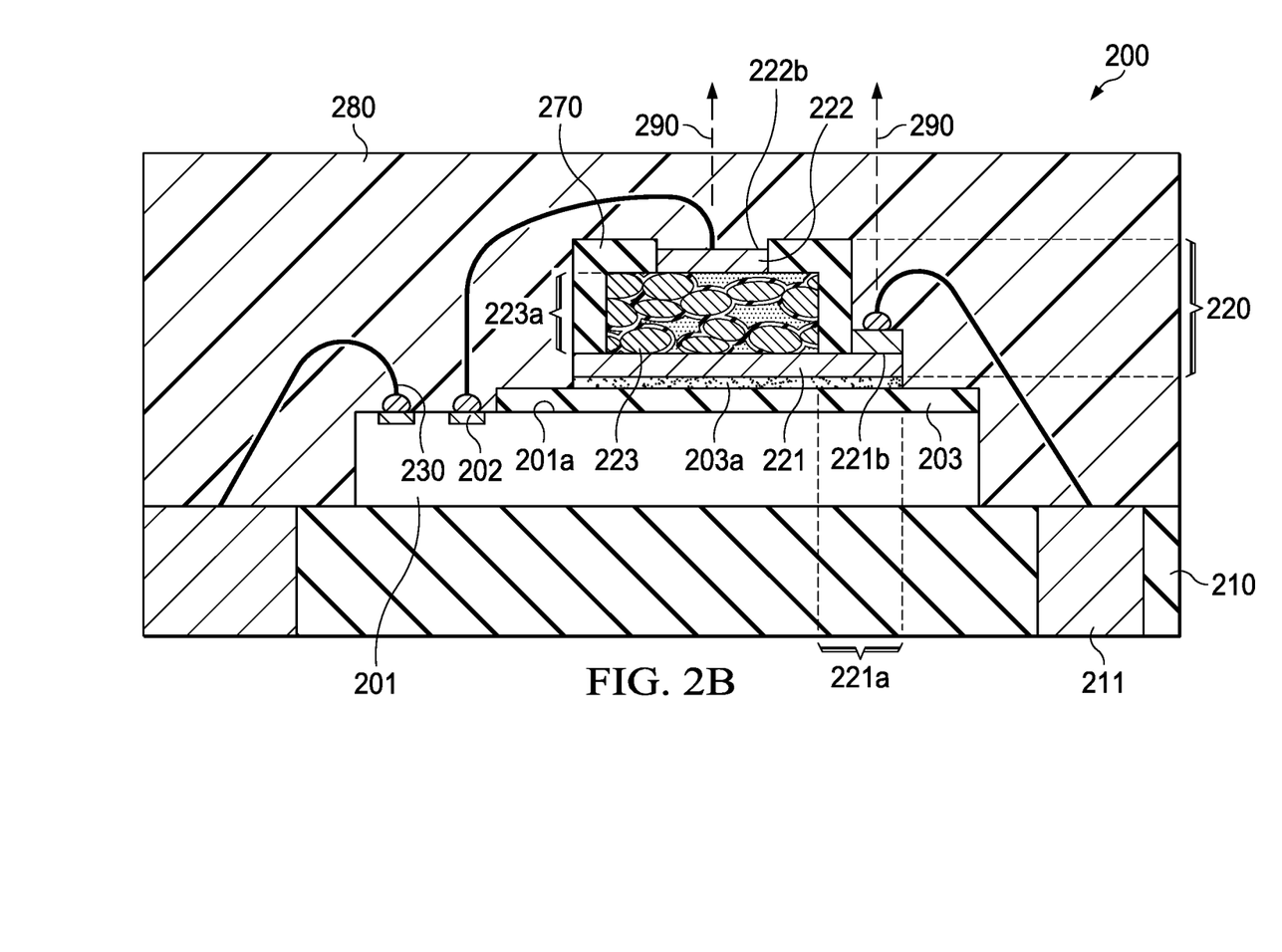
FIG. 2B is a cross section of another alternative arrangement similar to the arrangement of FIG. 2A where the capacitor has insulating layers on its sidewalls.

FIG. 2B illustrates in another cross section an additional arrangement that is in many respects analogous to the arrangement shown in FIG. 2A. However, in the arrangement of FIG. 2B, discrete component 220 includes insulating layers 270, which cover the sidewalls 223a. An example insulating material is a polyimide compound. The presence of insulating layers 270 prevents with certainty any incidental electrical contact between sidewalls 23a and bonding wires of wire bonds 230 contacting the protrusion 221a of first electrode 221.

The wire bonds 230 are bond wires such as shown in FIG. 2B and can be of any conductive material useful in semiconductor bonding such as copper, gold, silver, aluminum and alloys of these. Additional materials may be added to the conductor material in compounds to prevent corrosion or migration. The bond wires can be a variety of shapes including very fine flexible wires of circular or oval cross section, and can include prefabricated parts such as rails or clips us to 200 microns thick. Ribbon bonds can be used with the arrangements.

In the example arrangements of FIGS. 1A-1B, 2A-2B, a single discrete component is shown packaged with an electronic device, for example an integrated circuit. Additional arrangements include multiple discrete components, such as capacitors, mounted either side by side as shown in FIG. 1A for a single capacitor, or adjacent an integrated circuit die, and a single capacitor with multiple terminals can also be used in an arrangement. Stacked discrete components can be mounted beside an integrated circuit die or more than one integrated circuit die. The stacked arrangement of FIGS. 2A-2B shows a single discrete component, a capacitor in this example, however additional arrangements can include multiple discrete components stacked on an integrated circuit die, and further, stacked on one another and on the integrated circuit die. In the arrangements at least one discrete component is packaged with an integrated circuit die, in additional arrangements many discrete components can be packaged with at least one integrated circuit die; in addition, several integrated circuit dies can be packaged with discrete components to form additional arrangements. In still further arrangements the electronic device 201 can be another passive component instead of an integrated circuit.

Figure 3:
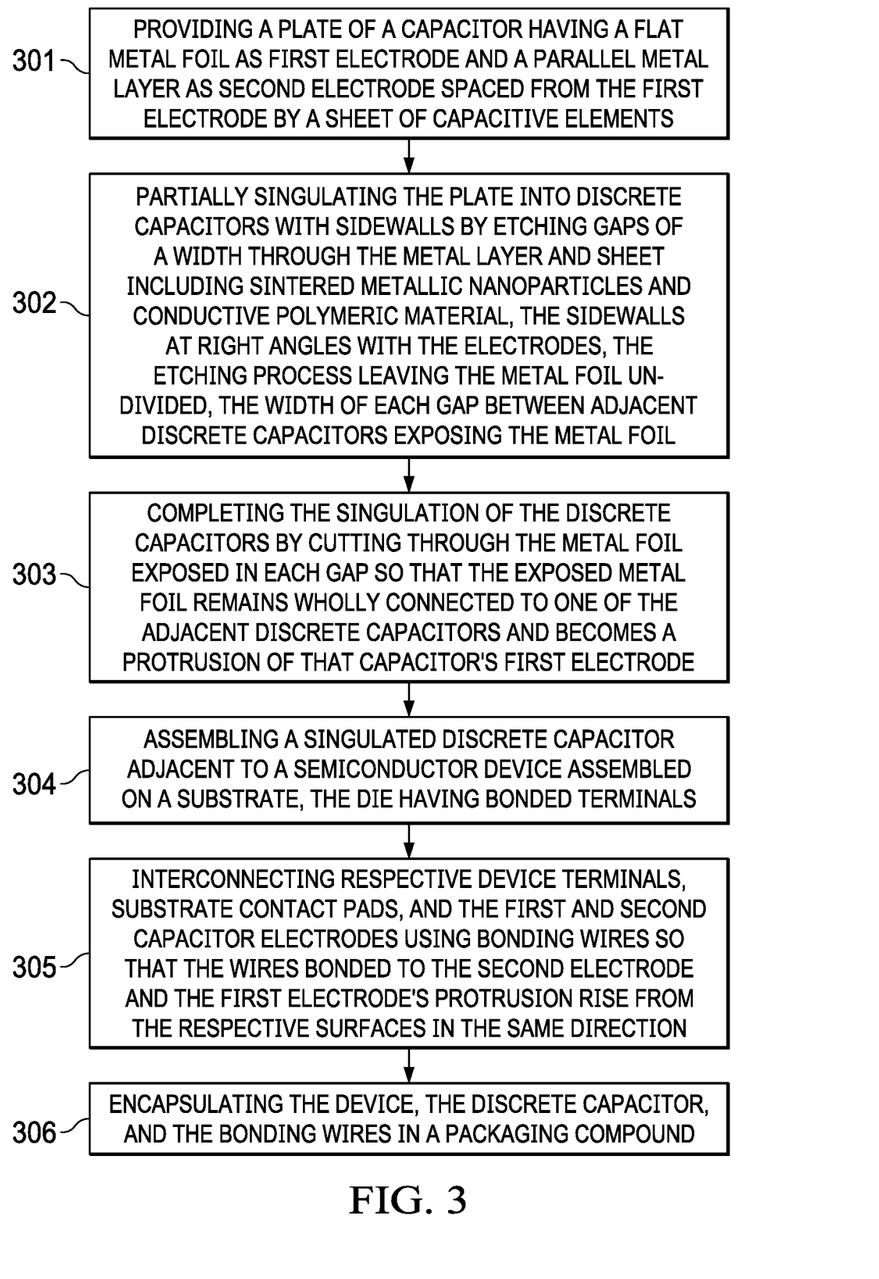
FIG. 3 is a flow diagram displaying the process steps of a method for fabricating a packaged semiconductor system with unidirectional connections to a discrete nanoparticle capacitor.
Figure 4:
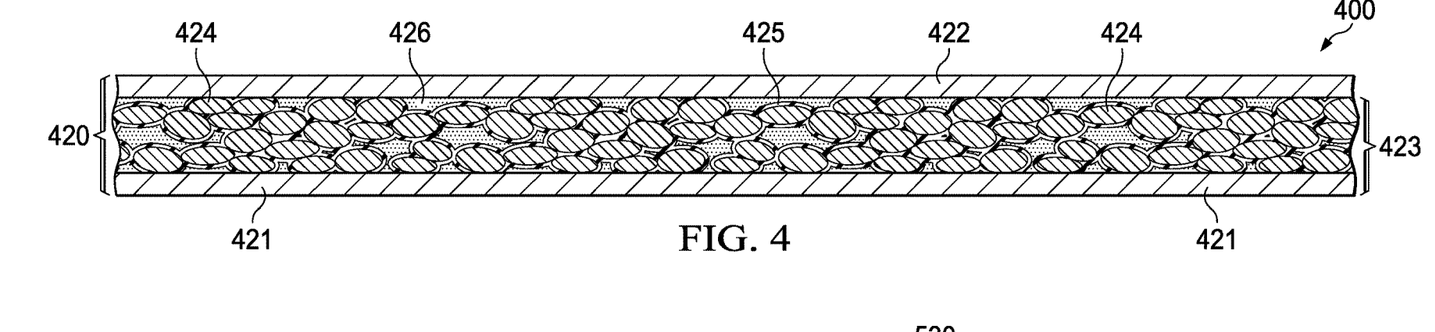
FIG. 4 is a cross section illustrating a flat plate of a capacitor with nanoparticle capacitive elements.

FIG. 3 is a flow diagram for a process flow for fabricating a packaged electronic system with unidirectional connections to discrete components such as nanoparticle capacitors and/or other components. While the blocks of FIG. 3 describe a capacitor as the discrete component, the method arrangements can be used with other discrete components as described hereinabove. FIGS. 4 to 8 illustrate in cross sections the results of several of the process steps of FIG. 3. The process flow starts in FIG. 3 with step 301; the step depicted in FIG. 4. A plate 400 of a capacitor 420 is provided, which has a flat metal foil as first electrode 421 (for example, the metal foil can be made of tantalum) and a parallel metal layer as second electrode 422. The first and second electrodes 421, 422 are spaced from each other by a sheet 423 of nanoparticle capacitive elements. Note that if the method arrangement is applied to other component types, the sheet 423 can be of another component material, such as coils, for inductors, or resistive material, for resistors, as examples. Sheet 423 of the capacitive elements comprises a porous conglomerate of sintered metal particles 424 (for instance tantalum). The sintered metal particles 424 are contacted by first electrode 421. The metal particle surfaces are covered with a dielectric skin 425, which can be created by oxidation of the particle metal or by coating the metal particles with an insulating material. The voids and pores between the dielectric skin-covered sintered metal particles 424 are filled by a conductive polymeric material 426. The thickness of capacitor 420 may be less than 50 μm.

The sintered metal particles 424 are referred to as nanoparticles. The concept of nanoparticles as used herein includes spherical or other three-dimensional clusters composed of atoms or molecules. For the purposes herein, nanoparticles are preferably selected from metals such as tantalum and aluminum; other useful metals include copper, silver, gold, tin, zinc and bismuth. After the nanoparticles are dispersed by a solvent, energy is provided to elevate the temperature for sintering the nanoparticles together. When sintering together, the nanoparticles are necking between the particles into a barely liquid network structure, which is then cooled and hardened to a solid to create the sheet 423.

Alternative arrangement methods for forming the discrete capacitors (or other discrete components) include using pre-patterned materials such as photoresist or a physical mask to separate the individual devices from one another, chemical etch as described herein, physical singulation methods such as by mechanical sawing, by laser sawing, plasma sawing, by punching operations, or by serration and mechanical separation. In addition, in alternative methods a component other than a capacitor is formed on the foil and provided in step 301. Examples, as described hereinabove, include resistors, inductors, fuse, and antifuse materials. These materials can be singulated to form corresponding discrete components. Coils separated by dielectric layers can form inductors and transformers on the metal foil. Stacked capacitors and stacked resistors can be provided to increase density using 3D arrangements. Stacked fuses and antifuses can be used with the arrangements.

Figure 5:
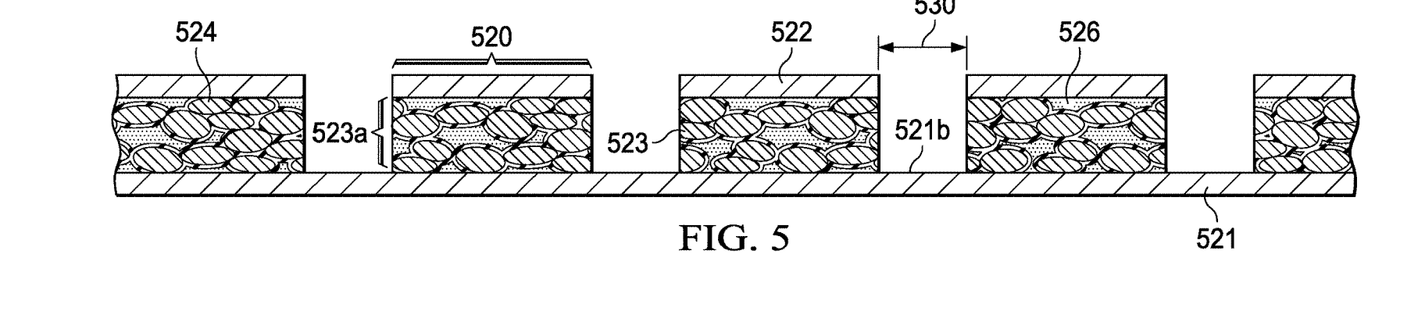
FIG. 5 illustrates in a cross section a process of partially singulating the plate of FIG. 4 into discrete capacitors.

During the next process step 302 in FIG. 3, displayed in FIG. 5, the plate 400 is partially singulated into discrete capacitors 520 with sidewalls 523a by etching gaps of a width 530 through the metal layer 522 and the sheet 523 including sintered metal nanoparticles 524 and conductive polymeric material 526. The sidewalls 523a are at right angles with respect to the adjacent surface of metal foil 521. The etching process leaves the metal foil 521 un-divided; the width 530 of each gap between adjacent discrete capacitors exposes the metal foil 521. The surface 521b of the exposed metal foil 521 is made bondable by depositing a layer of a metal such as silver, gold, copper, aluminum, and tin. For the continuation of the process flow, there are two process options: either adding protective layers onto the partially singulated capacitor, or completing the singulation process.

Figure 6:
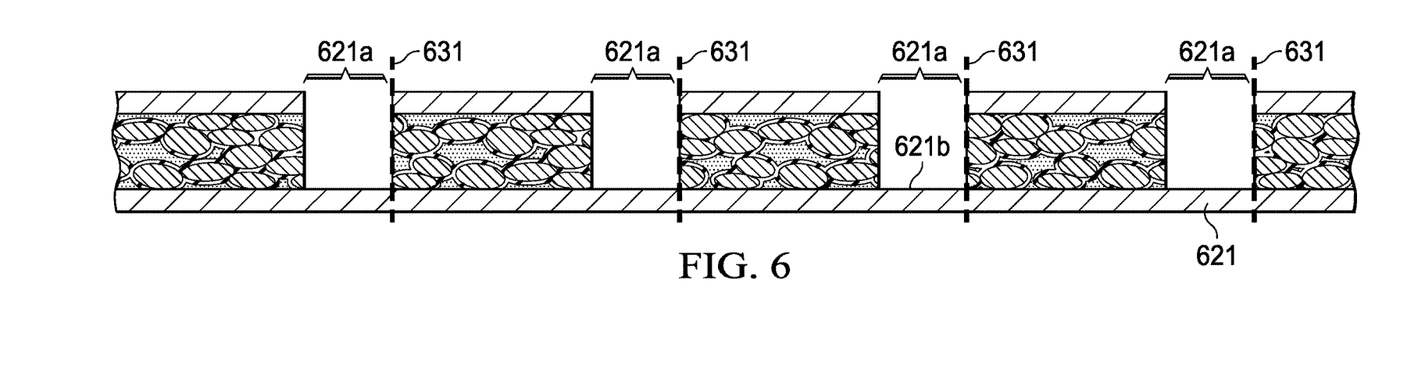
FIG. 6 illustrates in a cross section the process of completing the singulation of the discrete capacitors of FIG. 5 while creating protrusions forming a capacitor's electrode.

The latter option is executed in step 303 and indicated in FIG. 6. The discrete capacitors are singulated by cutting through the metal foil 621, which is exposed in each gap. The cutting action is performed along cut lines 631 in such locations that the exposed metal foil 621 in each gap remains wholly connected to one of the adjacent discrete capacitors. Consequently, the exposed portion of metal foil 621 becomes a protrusion 621a of that capacitor's first electrode. In an example method, the surface 621b of the protrusion 621a can be made bondable by depositing a layer of bondable metal. Note that the cut lines 631 can be located differently than shown in FIG. 6; for example the cut lines 631 can be centered between devices or moved adjacent the right side of the devices as oriented in FIG. 6. In alternative arrangements multiple protrusions can form, i.e. on each side of the components. The arrangements cut through foil 621 in a manner that leaves a protrusion 621a sufficient to form a terminal for bonding and making electrical contact to each individual device after singulation. If the cut lines 631 are moved from the locations in FIG. 6 so that multiple protrusions form for each component, these multiple locations can form multiple bonding surfaces.

Figure 7:
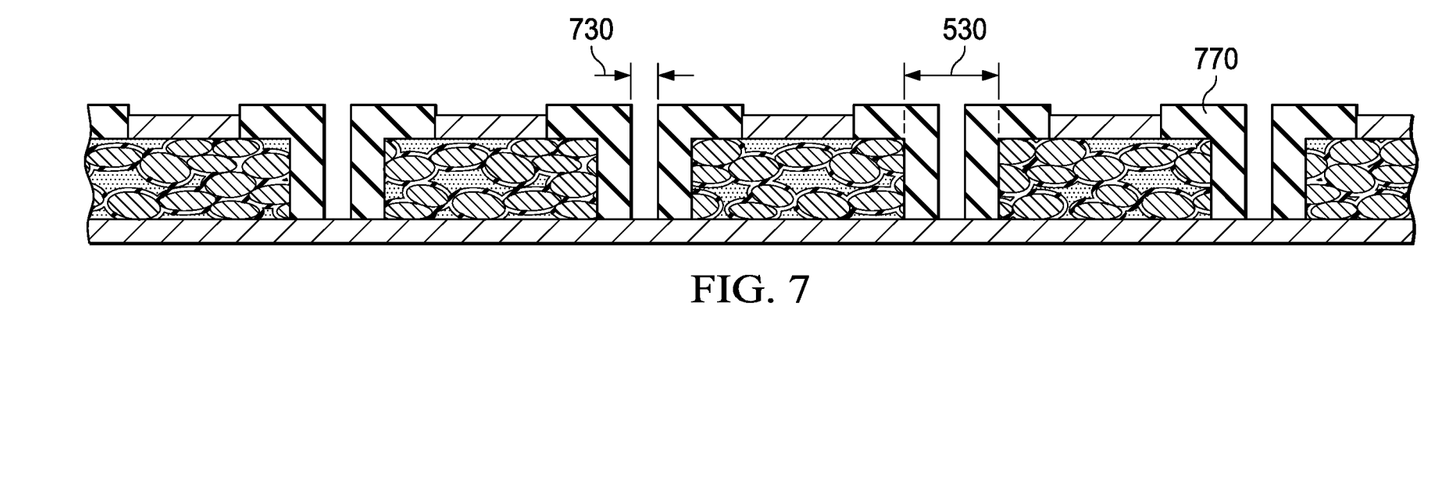
FIG. 7 is a cross section illustrating the process of forming insulating layers on the sidewalls of the discrete capacitors of FIG. 5.

The former process option is indicated in FIG. 7. A protective layer 770 of insulating material is added to the sidewalls of the partially singulated capacitors. Preferred insulating materials include polyimide and photoresist compound. As FIG. 7 shows, the addition of the protective layer 770 decreases the etched gap width 530 to the narrower width 730. After the addition of the insulating sidewall layers, the singulation of the discrete capacitors is completed.

Figure 8:
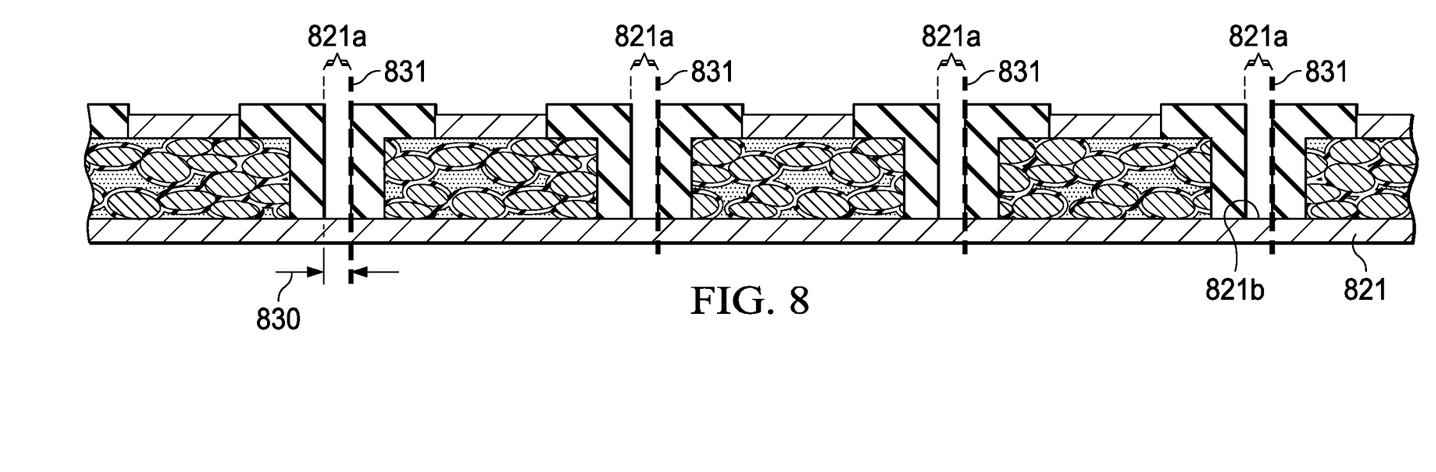
FIG. 8 illustrates in a cross section the process of completing the singulation of the discrete capacitors of FIG. 7 while creating protrusions forming a capacitor's electrode.

FIG. 8 illustrates the completion of the singulation of the discrete capacitors, step 303 in FIG. 3. The metal foil of the first electrode 821, exposed in each gap, is cut along cut lines 831. The cutting action is performed along cut lines 831 in such locations that the exposed metal foil of first electrode 821 forms a protrusion 821a and remains wholly connected to one of the adjacent discrete capacitors. In addition, the surface 821b of the protrusion 821a is made bondable by depositing a layer of bondable metal onto surface 821b.

During the next process step 304, a singulated discrete capacitor is assembled adjacent to an electronic device assembled on a substrate; the electronic device has bondable terminals and may for example be a semiconductor integrated circuit die. An example of this process step for a system where the discrete capacitor it not in contact with the device, is shown in FIG. 1A; an example of the process step for a system where the discrete capacitor is indeed in contact with the electronic device (with the help of an adhesive layer), is given in FIG. 2A.

During process step 305 in FIG. 3, respective device terminals, substrate contact pads, and the first and second capacitor electrodes are interconnected using bonding wires so that the wire bonds bonded to the second electrode and the first electrode's protrusion rise from the respective surfaces in the same direction. Examples are shown in FIGS. 1A (direction 190) and 2A (direction 290).

During process step 306, the electronic device, the discrete capacitor, and the wire bonds are encapsulated in a packaging compound. Note that as shown in FIGS. 1A-1B, 2A-2B the molding compound covers the electronic device (a semiconductor die in this example), the wire bonds, and the discrete component (e.g., a capacitor), and the surface of the substrate that the electronic device is mounted to (the upper surface of the substrate in FIGS. 1A-1B, 2A-2B), while the opposing surface of the substrate, and an exterior surface of the terminals of the package semiconductor systems are not covered by the packaging compound.

Various modifications and combinations of the illustrative arrangements, as well as other arrangements, will be apparent upon reference to the description. As an example, in semiconductor technology, the arrangements apply not only to active semiconductor devices with low and high pin counts, such as transistors and integrated circuits, but also to combinations of active and passive components mounted on a substrate.

As another example, the arrangements apply not only to silicon-based semiconductor devices, but also to devices using gallium arsenide, gallium nitride, silicon germanium, and any other semiconductor material employed in industry. The arrangements apply to substrates as laminated structures and to leadframes with cantilevered leads and to no-lead lead frames such as dual flat no-leads (DFN) and quad flat no-leads (QFN) type leadframes, as well as small outline no-lead (SON) type lead frames. As another example, the arrangements apply to wire bonds and ribbon bonds using copper, aluminum, silver and gold, alloys of these and compounds including these.

Modifications are possible in the described arrangements, and other arrangements are possible, within the scope of the claims.

What is claimed is:

1. A semiconductor package comprising:
a substrate;
a semiconductor die attached to, and electrically connected to the substrate; and
a capacitor including a first electrode attached to the substrate, a second electrode electrically coupled to the semiconductor die, and a sheet of capacitive elements between the first electrode and the second electrode, the first electrode extending laterally from a side wall of the sheet of capacitive elements, and electrically coupled to the substrate.

2. The semiconductor package of claim 1, wherein the sheet of capacitive elements includes metal particles covered in dielectric skins and a conductive polymeric compound filling spaces between the metal particles.

3. The semiconductor package of claim 1, wherein the substrate includes a first substrate contact pad electrically connected to a first terminal of the semiconductor die via a first wire bond.

4. The semiconductor package of claim 1, wherein the second electrode is electrically coupled between a second terminal of the semiconductor die to the second electrode via a second wire bond.

5. The semiconductor package of claim 1, wherein the first electrode is electrically coupled to a second substrate contact pad of the substrate via a third wire bond.

6. The semiconductor package of claim 1 further comprising molding compound covering portions of the substrate, the semiconductor die, and the capacitor.

7. The semiconductor package of claim 1, wherein a plane along the side wall is at a right angle with respect to a plane along a surface of the first electrode.

8. The semiconductor package of claim 1, wherein the first electrode and the second electrode are parallel to each other.

9. The semiconductor package of claim 1, wherein the first electrode and the second electrode are metal foils.

10. The semiconductor package of claim 1, wherein the metal particles include tantalum, and the dielectric skins of the metal particles include a tantalum oxide.

11. The semiconductor package of claim 1 further comprising at least one discrete component attached to the substrate and electrically connected to the semiconductor die.

12. The semiconductor package of claim 1, wherein the substrate is selected from a group consisting of a conductive lead frame, flame retardant epoxy resin substrate material (FR-4), bismaleimide-triazine (BT) resin, fiberglass, polyimide, ceramic, epoxy resin, and Kapton.

13. The semiconductor package of claim 1, wherein the contact pads of the substrate, the terminals of the semiconductor die, the second electrode and the protrusion of the first electrode are bondable surfaces including a metal layer selected from tin, nickel, palladium, silver, gold, copper, aluminum, and alloys and combinations thereof.

14. The semiconductor package of claim 1, wherein the substrate is a lead frame.

15. A semiconductor package comprising:
a substrate;
a semiconductor die attached to, and electrically connected to the substrate; and
a capacitor on the semiconductor die, the capacitor including a first electrode attached to the semiconductor die, a second electrode electrically coupled to the semiconductor die, and a sheet of capacitive elements between the first electrode and the second electrode, the first electrode extending laterally from a side wall of the sheet of capacitive elements, and electrically coupled to the substrate.

16. The semiconductor package of claim 15, wherein the first electrode is attached to the semiconductor die via a film.

17. The semiconductor package of claim 15, wherein:
the sheet of capacitive elements includes metal particles covered in dielectric skins and a conductive polymeric compound filling spaces between the metal particles;
the substrate includes a first substrate contact pad electrically connected to a first terminal of the semiconductor die via a first wire bond;
the second electrode is electrically coupled between a second terminal of the semiconductor die to the second electrode via a second wire bond; and
the first electrode is electrically coupled to a second substrate contact pad of the substrate via a third wire bond.

18. The semiconductor package of claim 15, further comprising molding compound covering portions of the substrate, the semiconductor die, and the capacitor.

19. A semiconductor package comprising:
a substrate;
a semiconductor die attached to, and electrically connected to the substrate;
a capacitor including a first electrode attached to the substrate, a second electrode electrically coupled to the semiconductor die, and a sheet of capacitive elements between the first electrode and the second electrode, the first electrode extending laterally from a side wall of the sheet of capacitive elements, and electrically coupled to the substrate;
an insulative layer covering the side wall; and
molding compound covering portions of the substrate, the semiconductor die, the capacitor, and the insulative layer.

20. The semiconductor package of claim 19, wherein:
the sheet of capacitive elements includes metal particles covered in dielectric skins and a conductive polymeric compound filling spaces between the metal particles;
the substrate includes a first substrate contact pad electrically connected to a first terminal of the semiconductor die via a first wire bond;
the second electrode is electrically coupled between a second terminal of the semiconductor die to the second electrode via a second wire bond; and
the first electrode is electrically coupled to a second substrate contact pad of the substrate via a third wire bond.

* * * * *